United States Patent
Scheel et al.

[11] Patent Number: 6,116,497
[45] Date of Patent: Sep. 12, 2000

[54] PROCESS AND DEVICE FOR THE WAVE OR VAPOR-PHASE SOLDERING OF ELECTRONIC UNITS

[75] Inventors: Wolfgang Scheel, Berlin; Karl Ring, Emmering, both of Germany; Willi Hafner, Balsthal, Switzerland; Helmut Leicht, Koenigsbrunn, Germany

[73] Assignee: Fraunhofer-Gesellschaft zur Foerderung der angewandten Forschung e.V., Munich, Germany

[21] Appl. No.: 08/952,912
[22] PCT Filed: May 24, 1996
[86] PCT No.: PCT/DE96/00968

§ 371 Date: Dec. 12, 1997
§ 102(e) Date: Dec. 12, 1997

[87] PCT Pub. No.: WO96/37330
PCT Pub. Date: Nov. 28, 1996

[30] Foreign Application Priority Data

May 24, 1995 [DE] Germany .............................. 195 19 188

[51] Int. Cl.[7] ............................................... B23K 1/08
[52] U.S. Cl. ............................................... 228/234.2; 228/37
[58] Field of Search .............................. 228/234.2, 37, 228/234.1, 102, 42, 225, 226

[56] References Cited

U.S. PATENT DOCUMENTS

| | | | |
|---|---|---|---|
| 3,866,307 | 2/1975 | Pfahl, Jr. et al. | 29/498 |
| 3,904,102 | 9/1975 | Chu et al. | 228/180 |
| 3,941,088 | 3/1976 | Ronafoldi et al. | 118/620 |
| 4,032,033 | 6/1977 | Chu et al. | 228/201 |
| 4,194,297 | 3/1980 | Pfahl . | |
| 4,855,559 | 8/1989 | Donner . | |
| 5,048,746 | 9/1991 | Elliott et al. | 228/180.1 |
| 5,146,694 | 9/1992 | Mishina et al. . | |
| 5,188,282 | 2/1993 | Johnson et al. | 228/234.2 |
| 5,538,175 | 7/1996 | Massini, Jr. et al. | 228/102 |
| 5,542,596 | 8/1996 | Cimbak | 228/234.2 |
| 5,560,537 | 10/1996 | Sadler et al. | 228/102 |
| 5,617,988 | 4/1997 | Willemen | 228/37 |

FOREIGN PATENT DOCUMENTS

| | | | |
|---|---|---|---|
| 0211563 | 2/1987 | European Pat. Off. | H05K 3/34 |
| 02537912 | 6/1984 | France . | |
| 2537912 | 6/1984 | France | B28B 11/00 |
| 22556110 | 6/1985 | France . | |
| 2556110 | 6/1985 | France | G05D 9/12 |
| 4024181 | 2/1992 | Germany | B23K 1/015 |

OTHER PUBLICATIONS

IBM Tech. Dis. Bull. vol. 28, No. 1, pp. 178–179, Jun. 1985.
Research Disclosure, Sep. 1991, No. 329.

*Primary Examiner*—Patrick Ryan
*Assistant Examiner*—Kiley Stoner
*Attorney, Agent, or Firm*—Karl Hormann

[57] ABSTRACT

A method of and an apparatus for vapor phase/solder wave soldering contacts of electronic components including temperature sensitive portions in which the components while moving through a soldering chamber are only partially immersed in a saturated vapor whereas the contacts are wholly immersed in the vapor. A solder wave having a crest substantially coinciding with the components to be soldered is provided within the saturated vapor and a layer of an inert gas is provided above the vapor ceiling.

35 Claims, 9 Drawing Sheets

TANTALUM
CAPACITOR
(SMD)

ELECTROLYTIC
CAPACITOR,
UPRIGHT

PROCESS AND DEVICE FOR THE WAVE OR VAPOR-PHASE SOLDERING OF ELECTRONIC UNITS

This application is a 371 of PCT/DE96/00968 May 24, 1996.

BACKGROUND OF THE INVENTION

1. Field of the Invention

The invention relates to a method and an apparatus for wave and/or vapor phase soldering of electronic components.

The invention may be used in the fabrication of electronic components in which soldering has nowadays to be performed in through-hole mounting on conventional components as well as on surface mount devices (SMD). Another field of application of the invention is soft-soldering of metallic semi-fabricated components.

2. State of the Art

It is well known that for soldering surface mount devices, reflow soldering processes are used. In such processes, the desired solder connections are fabricated by solder being reflowed and remelted as a solder paste by the application of energy. In known reflow soldering processes infrared radiation (infrared soldering) or hot gas (convection soldering), more particularly nitrogen, or laser radiation (laser soldering) or saturated vapor as in vapor phase soldering, are used. The most common processes utilized nowadays are infrared soldering, convection soldering and vapor phase soldering. Whereas infrared soldering is primarily used in connection with components of average complexity, low product variety and high volume, vapor phase soldering is particularly well suited for a high throughput or high volume at small spacings and high package densities, and it is for this reason used in SMD technology. With the development of new vapor phase soldering processes without fluorohydrocarbons as a secondary medium, these soldering processes have gained the greatest significance among the reflow soldering processes, particularly in view of the still more complex SMD components.

Conventional vapor phase soldering processes have been described, for instance, in German patent No. 3,518,444, European patent No. 0.349,094 and in the paper Produktronik, ½, 1993, pages 28–32, "Dampfphasenlö tanlagen in neuer Technik, Zum Leben erweckt" (Vapor Phase Soldering Equipment in New Technology, Resurrected) by H. Beine, in which the products or components to be heated are moved completely into the vapor range and are heated completely to the melting temperature of the medium used. In this connection, see in particular the operations diagram of FIG. 2 of the last mentioned paper in which the vapor line rises above the product to be soldered as soon as the solder material is heated to the boiling temperature of the used medium. In vapor phase soldering energy is released as heat on the surfaces of the solder material when a saturated vapor phase condenses. The solder reflows because of the released condensation heat, wets the components to be joined and leads to a material connection between the component connector and the associated contact structure on the component support. The thickness of the condensation film at or on the component to be connected determines the soldering time on the basis of the surface resistance. The vapor condensate also acts as a cleaning agent as it rinses dirt and other sediments off the component (contacts). The saturated vapor phase is generated by a boiling primary fluid. Thus, the boiling point of the primary fluid determines the operating temperature of the soldering process, which remains constant relative to the process. In principle, a thermal overload of the component is avoidable by the components being heat resistant at least up to the soldering temperature. The selection of a primary fluid scaled to the boiling temperature serves to process different solder material.

The characteristics of a vapor phase soldering process are precisely defined soldering or operating temperature, inert atmosphere, uniform heating of the soldering goods, and it is suited particularly for processing components of very different heat capacities.

Its disadvantage is that aside from SMD components (more particularly tantalum capacitors) it does not also possible with reasonable effort to solder through-hole mounting components. Moreover, selective heating is not possible, i.e. the individual components must all be temperature resistant up to the soldering temperature, which either limits the soldering temperature or the solder material, or requires retrofitting of those components which are not temperature resistant. This affects particularly electrolytic capacitors which as a rule are designed for operating temperatures up to about 100° C., but which outgas at higher temperatures, and are destroyed. Other affected components are those containing non-temperature resistant plastics such as plugs and switches.

A further disadvantage is the fact that soldering temperatures have to be chosen which lie about 50° C. above the melting temperature, for instance 183° C. in the case of eutectic lead-tin solder in order to yield the best possible wetting and spreading of the solder.

A wave soldering process (in brief: wave soldering) is generally known for soldering components, especially of the through-hole technology. In this process, the lower surface of a component support carrying components on its upper surface is put into contact with a liquid solder material so that the contact legs protruding through the component support are wetted by solder and a soldered connection is formed after removal of the support from the solder. The solder material is more particularly provided as a wave of solder, the solder being pumped out of the solder bath forming an arch and is retrieved again and returned to the solder bath. If necessary, any impurities are removed as well. In this process, electrodynamic solder pumps are far superior to mechanical solder pumps.

Wave solder processes for soldering electronic components with eutectic lead-tin solder (melting temperature 183° C.) operate, depending upon the flux used, at a preheat temperature of about 110° C. to 130° C. at the side of the components or upper surface of the component support which at the opposite surface of the component support results in maximum temperatures of about 160° C. to 180° C. The energy additionally required to reach a soldering temperature of about 200° C. to 210° C. at the component surface is furnished by the solder wave from the lower surface of the component support. To this end, the solder wave temperature is set about 50° C. higher than the soldering temperatures. Solder wave temperature between about 245° C. and 260° C. are usual. In general, in known wave solder processes the solder wave temperature may be set up to about 270° C. For solder heat resistance of circuit boards the American standard J-STD-001 defines a temperature of 288° C. maximum.

The disadvantage of conventional wave soldering processes is that they usually operate in ambient atmosphere so that upon separation of the solder wave from the lower surface of the component support, bridges and burrs will form which permit soldering at spacings of up to about 0.5 mm only. In addition, the solder wave has to be of a temperature which exceeds the soldering temperature by about 50° C. so that following the transfer of energy from the solder wave through the lower surface of a component support to the upper surface the solder temperature there is safely reached. The problems of temperature sensitive components and the necessity of complex retrofitting of such components apply equally in this context. Further limitations result from the use of lead-free solders the melting temperatures of which lie significantly above the melting temperatures of 183° C. of eutectic lead-tin solders often used at present. Furthermore, either oil or nitrogen are often used to cover the solder bath.

A process and an apparatus for soldering electronic components are known from German published patent specification DE-AS 2,442,180. More particularly, FIG. 3 of this publication discloses a process suitable for a wave soldering process wherein circuit boards provided with components are moved through a container. A solder wave or fountain is formed within the container in a known manner. In addition, the container contains a primary liquid heated to its boiling point by heating elements, and which vaporizes. The saturated vapor permeates the entire container and is prevented by cooling devices from escaping at the entrance and exit channels of the container serving to feed the components into and out of the container, thereby to minimize losses of primary liquid. In this process, the wave of molten solder material is kept at a temperature above the boiling point of the primary liquid which, in turn, lies above the melting point of the solder.

Components to be soldered by a wave soldering process are fed into the container at room temperature through an input channel. They are preheated to a temperature above the melting point of the solder by the latent evaporation heat of the hot saturated vapor. As a result of the preheating, any solder layer on the components is melting and thus affects melting of the solder. The components enter the wave of molten solder in a preheated state, and are soldered therein. Rather than heating the components, the solder wave serves only to apply the solder. Because of this, the application of heat and the application of solder constitute two separate easily controllable operational steps. As the components leave the wave, the solder present on the components including the solder applied by the wave remain in a molten state so that because of solder flow resulting from surface tension soldering defects are prevented. Only after exiting from the channel does solidification of the solder take place as a result of cooling down to room temperature.

In a further embodiment of the known process, a primary liquid is chosen having a boiling point below the melting point of the solder. In that manner, a component is preheated by the vapor only, and the remaining energy for attaining the soldering temperature as well as the solder material are supplied by the solder wave.

The drawback of the invention described in German published patent specification DE-AS 2,442,180 is that temperature sensitive components have to be retrofitted because of the non-selectivity of the soldering process. This is especially disadvantageous in mass production because it necessitates additional process steps and because selective retrofitting of individual components is involved and often cannot be performed with the necessary quality.

OBJECT OF THE INVENTION

Building upon the state of the art referred to supra, it is an object of the present invention to provide an improved method and apparatus for soldering electronic components so that aside from lead-containing solder materials lead-free solder materials may also be used and that, moreover, conventional standard component modules may be soldered which usually are provided with components, e.g. surface mount devices, to be soldered and with components the contact legs of which protrude through the component support and that, furthermore, heat sensitive components, e.g. electrolytic capacitors, are not damaged or destroyed by soldering, and that mass production of high quality solder connections may be realized.

SUMMARY OF THE INVENTION

A solution in accordance with the invention of this task resides in a method of, and an apparatus for, soldering electronic component modules wherein, the wave soldering and the vapor phase soldering are carried out in a single chamber, an electronic component module is placed in such a manner, and/or the proportion of the volume of the chamber filled by the saturated vapor of a primary liquid is controlled in such a manner that heat sensitive components of the component module are positioned at most partially in the saturated vapor, and that the contacts to be soldered of the electronic components of the component module are located in the saturated vapor during soldering. By suitably placing a component module and/or regulating the partial chamber volume filled with saturated vapor complete enveloping of the heat sensitive components by saturated vapor is effectively prevented.

In the process, heat sensitive elements are distinguished on the basis of their resistance to soldering heat which is dependent upon the type of component, and the maximum permissible ambient temperature. Wired components and surface mounted devices (SMD=surface mount device) are types of components of especial significance.

Wired components usually have a solder heat resistance as defined in DIN IEC 68, part 2-20. In accordance with the test methods there described, only the contact wires to be soldered of a component are submerged in a solder bath of 260° C. or 350° C. (see FIG. 8) for a defined dwell time (e.g. 5 seconds), rather than the entire component. In accordance with this test the components must not change their electrical and mechanical properties. In contrast to the solder heat resistance of the contact wires to be soldered, entire wired components such as, for instance, electrolytic capacitors, may only be subjected to a defined long-term temperature strain. Depending on any given type, the maximum ambient temperature for a wired electrolytic capacitor is about 85° C. to 125° C.

The solder heat resistance of surface mounted devices is described in the CECC 00802 specification "Normed CECC Method of Specifying Surface Mountable Devices with Quality Assessment". Compared to wired components SMD's have a process-bound significantly higher solder heat resistance as well as a higher permissible ambient temperature. They are constituted to withstand the required maximum working temperatures of 260° C. (FIG. 6) or 215° C. (FIG. 7) without being destroyed or without derogation of their functioning.

In accordance with the method of the invention involving only partial submersion of the heat sensitive components, particularly standing wired electrolytic capacitors (see FIG. 5), a module of mixed components (wired components, SMD'S) may be soldered in a single process step (wave and vapor phase soldering) without destruction of the electrolytic capacitors, whereas in a process involving a typical temperature and time profile of the known singular vapor phase soldering (FIG. 7) or reflow soldering (FIG. 6) the wired electrolytic capacitors are completely destroyed by the evaporation. Other temperature sensitive components are those components containing non-temperature resistant plastics as, for instance, plugs and switches.

By partially submersing the heat sensitive components the different kinds of heat transfer are advantageously applied for limiting the heating of the components. In the vapor, heat transfer takes place primarily by condensation of the vaporized liquid on the colder mass to be soldered. Furthermore, heat is transferred to some extent by condensed droplets precipitating on the mass to be soldered. In the range above the saturated vapor, an aerosol is formed consisting of air and suspended droplets of the boiling medium. Heat transfer to the components is occurring by convection of the air and condensation of the droplets on the surface of the components. The transfer of heat by the aerosol is thus much lower than in the vapor. In a particular embodiment of the invention, heating over the layer of vapor is further reduced by evacuating the aerosol.

For regulating the volume of the chamber filled by the saturated vapor of the primary liquid, there are provided cooling apparatus by means of which the level of the vapor ceiling, i.e. the interface between saturated vapor and the remaining volume of the chamber or the aerosol may be adjusted to a predetermined value. Depending upon the structure of the apparatus in accordance with the invention, the level of the vapor ceiling is somewhat depending on the position, the level being slightly higher near the walls of the chamber than in the interior of the chamber. The majority of the condensed droplets of the liquid migrate downwardly again toward the boiling range. It has been found empirically that at a reduced heater capacity the interface between vapor and aerosol attains the state of equilibrium depicted in FIG. 9a–FIG. 9d after about 60 seconds. In FIG. 9a, temperatures are indicated at nine positions of a circuit board measuring 20 cm×40 cm and positioned approximately in the center of a soldering chamber measuring 30 cm×40 cm, the temperatures having been measured immediately after the circuit board was moved to the interface of vapor and aerosol. From FIG. 9b to 9d the setting of a temperature equilibrium may be seen at a non-moving circuit board. The limit line of the vapor ceiling (light-dark transition because of condensation) visible at the metal components of a soldering apparatus in accordance with the invention is uniformly attained in the entire surface. The level of the vapor ceiling may be controlled by sensor arrangements, particularly by temperature sensors, for defining the level of the vapor ceiling by an electronic control for the cooling apparatus.

In one embodiment of the method in accordance with the invention the cooling arrangements are pipe systems with a cooling medium flowing therethrough. Preferably, the pipe systems are arranged to be mechanically moved along the side walls of the chamber, and they are configured spirally. Furthermore, for changing the volume of vapor cooling traps structured as cooling plates may be moved, by a rotary pivoting movement in particular, into the space filled by the vapor. The cooling traps have a particularly large condensation surface and are thus particularly preferred for a quick change of a relatively large difference in the level of the vapor ceiling.

In another embodiment of the method in accordance with the invention one or more cooling shield devices of closed or of net-like structure are applied to the component module, preferably before the component module is moved into the chamber. The cooling shield devices prevent the saturated vapor from moving upwardly beyond the given shield device. In this manner complete submersion of the shielded components into the vapor is prevented.

Furthermore, the vapor volume, in particular the height of the vapor ceiling may be regulated by introducing into the vapor a liquid of a temperature below the temperature of the primary liquid vapor. Preferably, the selected liquid is the primary liquid which may be introduced, preferably by injection, into the chamber and, hence, into the vapor by suitable nozzle arrangements. This makes possible quickly and, by a precisely measured addition of the cold liquid, exactly to influence the vapor volume, in particular the level of the vapor ceiling. In concert with the measured injection of primary liquid into the vapor, an exact and quick control of the level of the vapor ceiling may be realized by sensor devices for defining the actual vapor ceiling level.

In a further embodiment of the method in accordance with the invention the vapor volume may be adjusted and controlled by partially or completely closing the apertures, in particular one or more nozzles through which the primary liquid is introduced into the chamber. Aside from the vapor inlet openings other valve arrangements in the vapor feed conduits to the chamber may also be used. Furthermore, the remaining volume of the chamber may at the same time be filled with a protective gas, in particular a noble gas or nitrogen. The latter serves to shield the component module and/or the solder wave.

The method in accordance with the invention makes it possible, depending upon the arrangement of the component module to be soldered, to use either wave soldering only or reflow soldering or to practice both in a single operational step for soldering the component module.

In one embodiment of the method in accordance with the invention the component module to be soldered is preheated to a predetermined temperature in one or more method steps prior to the actual soldering process, in order to prevent flash heating of the component module, to obtain a uniform temperature distribution and to provide the necessary activation time for an optionally used flux. As is known, preheating minimizes defects such as tombstoning (i.e. the erection of components because of localized differences in solder reflow). Preferably, the energy source for preheating is infrared radiation directed either directly onto the electronic component module to be heated, or by reflectors. Preferably, preheating takes place prior to moving the component module into the soldering chamber which is at least partially filled with primary liquid vapor.

In a further embodiment of the method in accordance with the invention heated primary liquid is applied to the component module for preheating it, preferably by nozzles mounted on the ceiling of the chamber.

In a further embodiment of the method in accordance with the invention saturated steam, preferably adjusted to the preheating temperature, filling at least a portion of the volume of the chamber is used for preheating the electronic component module.

In the method in accordance with the invention the temperatures at the upper surface of the module support and at the lower surface of the module support may be set to different values which is carried out by selecting different boiling temperatures for the primary liquid and for the adjustable solder wave temperature. When wave soldering and vapor phase soldering are performed in a single operational step the method in accordance with the invention makes it possible to select the temperature of the solder to be the same as or slightly above the melting temperature of the solder material. More particularly, the used primary liquid has the same or a slightly higher boiling point than the soldering temperature. By an appropriate selection of the soldering temperature the solder wave may satisfy several tasks. It may serve to apply solder material to the lower surface of the module support; it may, moreover, furnish at least a portion of the wave soldering energy. Finally, in vapor phase soldering the solder wave may contribute additional energy aside from the energy released by the condensed vapor, so that vapor phase soldering may be performed in a shorter time and the required quality of the solder connection thereby produced may be reliably attained.

The method in accordance with the invention may be advantageously practiced particularly for soldering with lead-free solder materials the melting temperature of which lies above the eutectic temperature of lead-tin solder (about 183° C.). Since the solder wave temperatures of known solder wave modules lie between about 240° C. and 270° C., it is possible to solder with lead-free solder materials in particular, having melting temperatures between about 183° C. and about 270° C., at process temperatures, i.e. solder wave temperatures of conventional solder wave equipment. This is of significance in connection with tin-silver solder materials. For using tin-silver solder having a melting point of 221° C. a known wave solder method would require a solder wave temperature of 270° C. A solder wave temperature slightly above the melting point of 221° C. suffices in the method according to the invention.

An apparatus for soldering electronic modules, more particularly for practicing a method in accordance with the invention for soldering electronic modules, comprises a chamber filled in at least part of the chamber volume with a saturated vapor of a primary liquid, and, further, an arrangement for wave soldering located at least partially within the chamber, as well as an arrangement for feeding an electronic module into the chamber, through the chamber and out of the chamber, there being provided an arrangement with which the chamber volume filled by the saturated vapor may be variably adjusted.

In one embodiment of the apparatus according to the invention there are also provided one or more preheating arrangements for one or more electronic modules to be subsequently soldered in the chamber. Such arrangement for preheating is either provided within the chamber or, preferably, outside of the chamber. Preferably, one or more infrared radiators and/or component reflecting infrared radiation are utilized for the preheating.

Furthermore, there is provided in one embodiment of the apparatus in accordance with the invention an arrangement within the chamber and/or within the walls of the chamber by which heated primary liquid may be applied to an electronic module for the preheating thereof. Preferably, the arrangement comprises one or more nozzles by which the heated primary liquid is sprayed onto the module.

After termination of the soldering operation within the chamber the soldered electronic module is moved out of the chamber, preferably through an exit lock. Following the exit lock, there is provided a cooling and evaporation arrangement where cooling of an electronic module may take place under defined conditions.

In one embodiment of the apparatus according to the invention a reservoir or storage container is provided for the primary liquid in or at which there is provided a heater for heating the primary liquid to its boiling point. Preferably, the primary liquid reservoir is provided on the bottom of the chamber from where the saturated primary liquid vapor fills part of the chamber volume from its bottom up to a variably definable level. Preferably the primary liquid is electrically non-conductive and non-oxidizing; moreover, it is chemically stable and inert, non-toxic, non-flammable and is of higher density than air. It preferably has a rather high latent heat of vaporation and a define boiling point. In order to defined the boiling point as exactly as possible the primary liquid consists of but a single liquid component. In a further embodiment of the invention the remaining volume of the chamber, except for the saturated vapor and, optionally, the primary liquid as well as the solder wave arrangement, is filled with a protective gas, particularly a noble gas or nitrogen, to which end there are provided appropriate inlet openings.

In another embodiment of the invention the primary liquid reservoir is provided outside of the chamber, one or more conduits for the saturated primary liquid vapor leading from the reservoir to the chamber and the vapor flow being controllable by a valve arrangement. Preferably, nozzles are provided at the end of such a conduit adjacent to a chamber wall which may at least be closed partially and thereby function as valves.

An apparatus in accordance with the invention is provided with one or more cooling arrangements for variably setting the volume of the chamber filled by the primary liquid vapor. In particular, the level of the vapor ceiling which is usually dependent upon the location may thereby be set and/or adjusted to predeterminable position-dependent elevational values. At least in the vicinity of the electronic module moved into the chamber for soldering, the vapor ceiling is preferably formed as an almost planar surface, and at least in this vicinity the level of the vapor ceiling may be precisely set and controlled to within several millimeters. In a preferred embodiment of the invention the vapor ceiling, i.e. the interface between the saturated vapor in the lower portion of the chamber and the remaining volume of the chamber, is formed as an entirely planar surface so that for indicating the level of this interface or vapor ceiling a single elevational value suffices.

Moreover, these cooling arrangements are best arranged to be mechanically moved along the sidewalls of the chamber. They are preferably structured as pipe systems through which the cooling medium is flowing, and/or they consist of several partial pipe systems which may be cooled independently of each other for setting the level of the vapor ceiling.

Furthermore, there are provided cooling traps structured as cooling plates with relatively large condensation surfaces which may be moved into the chamber volume filled with saturated primary liquid vapor. The cooling plates are preferably rotatably mounted at a wall of the chamber near its ceiling and are aligned substantially parallel to the ceiling of the chamber from where they may be rotatably pivoted into the vapor.

The level of the vapor ceiling may further be controlled, especially in a localized manner, by cooling shield arrangements superposed on an electronic module. By an appropriate geometric design of a shielding arrangement which must be based upon the positions and geometric dimensions of the temperature sensitive components of the module, these very components are protected from too high a temperature strain and from damage or destruction as a result thereof.

Furthermore, in another embodiment of the invention there are provided nozzle systems, especially at the ceiling of the chamber and/or adjacent chamber walls which allow primary liquid to be introduced into the chamber and into the saturated primary liquid vapor in precisely measured quantities. The vapor condenses at the introduced droplets of primary liquid whereby the vapor ceiling is reduced or moved downwardly in the chamber in the direction of the solder wave.

An apparatus in accordance with the invention is furthermore provided with arrangements for the withdrawal of the condensed primary liquid vapor, these withdrawal arrangements being preferably structured such that they recirculate the condensate into the primary liquid reservoir.

An apparatus according to the invention is furthermore provided with an arrangement for wave soldering, such as a wave solder module providing a solder wave. In this connection, an electrodynamic solder pump is preferably utilized. As long as no module is in contact with the solder wave, the solder wave is completely surrounded by saturated vapor. The saturated vapor thus provides the solder wave with protection from oxidation. Also, the solder from which the solder wave is pumped up, the so-called solder bath, is protected from oxidation by the saturated vapor. During the cooling phase, i.e at a reducing vapor volume, primary liquid is utilized as oxidation protection for the solder bath. To this end, vapor condensed to primary liquid is moved by withdrawal arrangements to the surface of the solder bath to cover it. In a further embodiment of the invention, primary liquid from the primary liquid reservoir or other available primary liquid is moved over the solder bath surface for the same purpose.

A transport arrangement for an electronic module is structured such that a solder angle may be set between 0° and 10°. The solder angle is set as the angle between the tangential plane at the highest point of the solder wave and the plane of the module support.

In another embodiment of the apparatus in accordance with the invention an arrangement for the recognition of an electronic module, more particularly of the type of module to be soldered, is provided ahead of the soldering unit. Relevant solder parameters may be set, or adjusted to a specific module to be soldered, on the basis of the characteristic data of the module or the components thus detected. Thus, wave soldering only or vapor phase soldering only may be utilized and/or the temperature of the solder wave may be changed. Preferably, the recognition arrangement is utilized outside of the chamber ahead of feeding a module into the chamber through an inlet lock. Preferably, it consists of a camera system.

Further advantages of the inventive method and inventive apparatus are described hereinafter.

The invention makes it possible to solder surface mountable, through-hole and heat sensitive components in a single operational step and in a single apparatus or chamber. This opens up economic mass production, while maintaining high quality, for the fabrication of any desired structures with a soldering apparatus in accordance with the invention which is structured as a feed-through system.

Along with the advantage of solderability of heat sensitive components, the invention also subjects other components as well as the module support to a lower temperature strain. All in all, the fabricated solder connections are of improved reliability.

The cooperation of inert vapor phase and wave soldering reduces the formation of bridges and burrs to an extent that modules with a spacing of up to 0.3 mm may be soldered instead of 0.5 mm as has been the case heretofore. Since the vapor temperature at the upper surface of the module support, i.e. the primary support surface, may be set by the selection of the boiling point of the primary liquid and may be selected to be the same as or slightly higher than the melting point of the solder material, the solder wave need no longer contribute additional energy for the vapor phase soldering. The solder wave may thus be operated at a temperature corresponding to, or slightly higher than, the soldering temperature. Thus, the invention makes it possible to reduce the solder temperature close to the melting temperature of the solder.

This leads to the further advantage that soldering may be performed with lead-free solders with melting temperatures as high as the solder wave temperatures of about 270° C. as customarily used nowadays. In conventional soldering plants lead-free solders may, because of the requisite difference of about 50° C. between the solder wave temperature and the solder temperature, may be soldered at best at melting temperatures up to 220° C.

The use of a primary liquid vapor for vapor phase soldering as well as an inert medium offers the advantage that no protective gas or vacuum is required for inert soldering, so that there is no need for control, regulating and safety equipment connected therewith. Moreover, the cooperation of wave soldering and vapor phase eliminates the need for the covering oil otherwise necessary in a wave soldering module, since the primary liquid vapor covers the solder bath as an oxidation protection. The saturated vapor thus is a carrier of energy for the soldering as well as an oxidation protection.

In one embodiment of the invention heated primary liquid is used for preheating the module to be soldered. Thus, the primary liquid and its saturated vapor constitute a unitary medium as energy carrier for the soldering operation, as oxidation protection and for preheating.

The transport and/or positioning arrangement for an electronic module permits transporting and placing of the module at a predetermined exactness and stability. Also, the level of the vapor ceiling may be set and controlled with a precision depending upon the structure of the embodiment of the invention. By means of the invention, either with either measure by itself or in combination, the heat sensitive components will be placed no more than partially within the saturated primary liquid vapor. This results in the advantage of utilizing that one of the mentioned measures for precision controlling which offers greater precision and/or higher stability. If, for instance, the level of the vapor ceiling is lowered after the soldering operation and at the same time the module is maintained in its position, a substantially vibration-free cooling of the liquid solder may be accomplished, at least during this phase.

DESCRIPTION OF THE DRAWINGS

The invention will hereinafter be described on the basis of embodiments with reference to drawings, in which.

DESCRIPTION OF PREFERRED EMBODIMENTS

Figure 1:
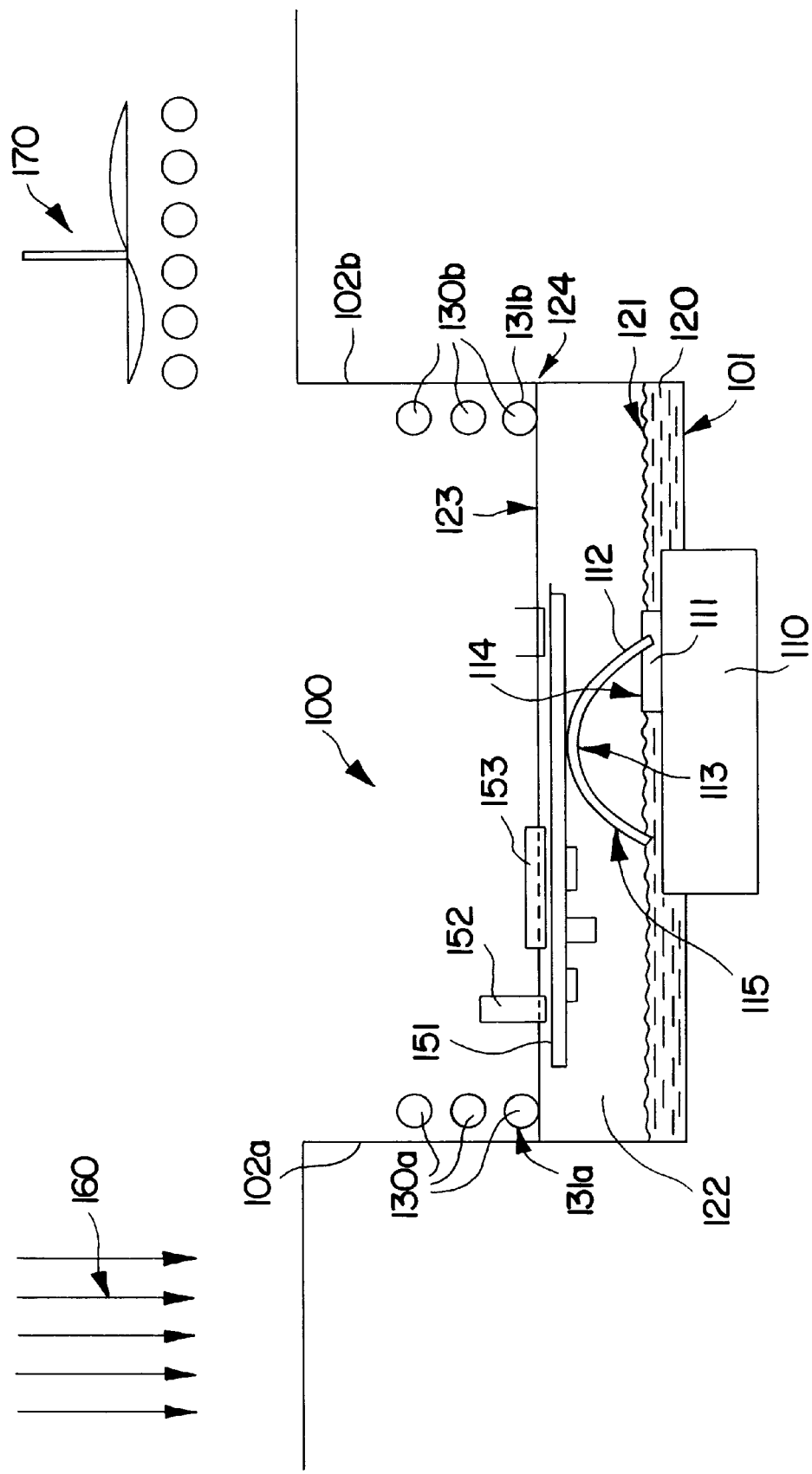
FIG. 1: is a cross-sectional presentation of an apparatus in accordance with the invention for wave and/or vapor phase soldering having a primary liquid reservoir in the soldering chamber.

A first embodiment of an apparatus in accordance with the invention is shown in FIG. 1. In FIG. 1, there is schematically shown a soldering chamber (100) with a portion of a solder wave module (110) penetrating into it. The lower portion of the space of the soldering chamber serves as a primary liquid reservoir, the primary liquid (120) covering the bottom (101) of the chamber and extending up to a predetermined height of the chamber. By a heating arrangement not shown in FIG. 1 the primary liquid is evaporated. The saturated primary liquid vapor (122) directly fills a portion of the volume of the chamber above the surface (121) of the primary liquid. In an upward direction the primary liquid vapor is limited by its vapor ceiling (123), the level of the vapor ceiling being set to a desired value by cooling arrangements (130*a*), (130*b*) mounted at the side walls (102*a*), (102*b*) of the chamber.

The cooling arrangements (130*a*), (130*b*) may be submerged into, and withdrawn from, the vapor in a direction parallel to the side walls relative to the bottom of the chamber (tolerance ±0.5 mm). In the embodiment depicted in FIG. 1 the cooling arrangements are pipe systems (130*a*), (130*b*) through which a cooling medium such as water or primary liquid or liquid nitrogen is circulated. At the bottom edge of the lowest cooling pipe (131*a*), (131*b*) the rising vapor (122) condenses so that the lower edge of this cooling pipe determines the level (124) of the vapor ceiling. The cooling arrangements are structured and coordinated with the soldering chamber such that a substantially horizontal and planar vapor ceiling (123) results at any set vapor ceiling level. The precision with which the level of the vapor ceiling may be set is realized by the specific geometric design of the cooling pipe systems and their movers (not shown), e.g. by spindle drives or multiple joint transmissions.

The solder wave module (110)extends only partially into the solder chamber (100) only partially. From the solder bath (111) the solder is pumped upwardly as a solder wave (112) into the saturated vapor (122), reaches an apex (113) and flows downwardly again to a retrieval arrangement (115) of the solder wave module. The height of the solder wave, in particular its apex, over the surface (114) of the solder bath may be adjusted independently of the temperature of the solder wave. The surface (121) of the primary liquid is coordinated with the solder wave module (110) extending into the solder chamber such that the surface (114) of the solder bath and the entire solder wave are in contact with the saturated vapor (122) only, except where solder wave contacts an electronic module to be soldered. In another embodiment of the invention the surface of the solder bath is covered by a liquid medium.

Utilizing the apparatus depicted in FIG. 1 an electronic module consisting of a module support (151) having components thereon, is preheated by infrared radiation (160) (schematically shown) before it is introduced into the soldering chamber (100). The preheated module is moved further into the chamber (100) by a transport arrangement not shown in FIG. 1 and is sufficiently lowered into the chamber such that the lower surface of the module support (151) contacts the solder wave (112) near its apex (113) and the temperature sensitive components, for instance (152), (153) are only partially surrounded immersed in the saturated vapor whereas their contact legs are completely immersed in it.

Following the soldering operation, the electronic module is moved out of the saturated vapor by the transport arrangement and is thereafter moved out of the chamber and is cooled under defined conditions in a schematically shown cooling and vaporizing station (170).

Figure 2:
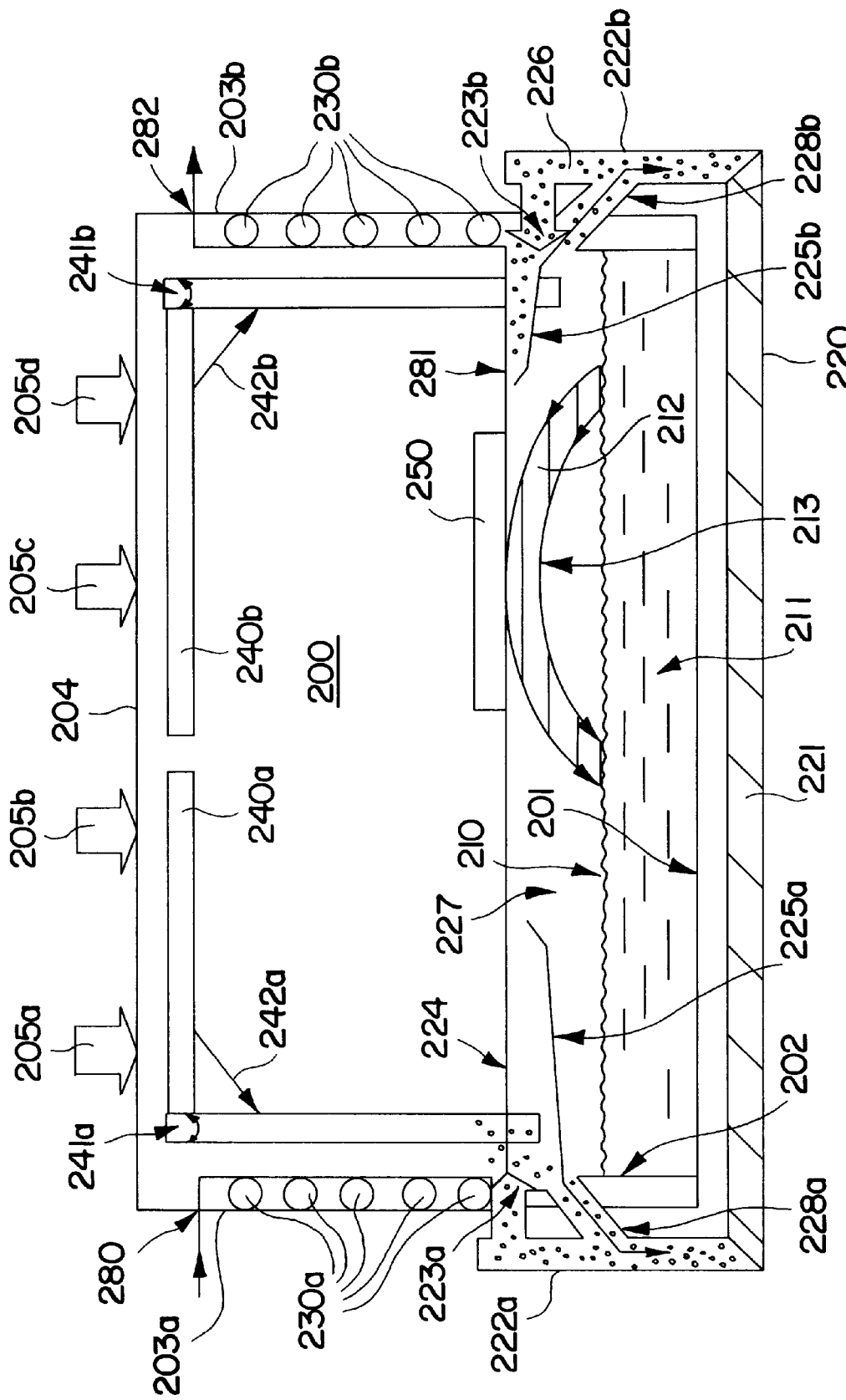
FIG. 2: is a cross-sectional presentation of an apparatus in accordance with the invention for wave and/or vapor phase soldering having a primary liquid reservoir outside of the soldering chamber.

A further embodiment of an apparatus in accordance with the invention is schematically depicted in FIG. 2. A soldering chamber (200) contains the solder in its lower portion, the solder covering the bottom (201) of the chamber as a solder bath (211) and extending to a predetermined solder bath level (202). A solder wave (212) reaching its maximum height at its apex (213) is pumped upwardly from the solder bath (211) and thereafter flows back to the solder bath (211). Furthermore, a primary liquid reservoir (220) is arranged outside of the chamber (200). The primary liquid (221) contained therein is evaporated by heater arrangements (not shown in FIG. 2) and the generated saturated primary liquid vapor (226) is fed into the chamber through chamber openings (223*a*), (223*b*) by way of conduits (222*a*), (222*b*). The primary liquid vapor (226) fills that portion of the volume of the chamber extending from the surface 210 of the solder bath (211) to a height 224 of the chamber (224) defined by the cooling arrangements (230*a*),(230*b*). Care is taken that the solder wave (212) always remains within the part of the chamber which is filled with the inert primary liquid vapor.

The cooling arrangements (230*a*),(230*b*) are structured as pipe systems and are mounted for mechanical movement along the side walls (203*a*),(203*b*) of the chamber. The cooling arrangements may be vertically moved between of the chamber or to the bottom (201) of the chamber or to the ceiling of the chamber (204), movement taking place substantially parallel to the given wall of the chamber. Below the cooling pipe systems (230*a*),(230*b*) mounted at the walls of the chamber there are provided retrieval trays (225*a*), (225*b*) which catch the primary liquid formed by condensation of the saturated vapor (227) at the cooling pipe systems and return it to the primary liquid reservoir by way of conduits (228*a*),(228*b*).

Moreover, cooling plates (240*a*),(240*b*) are provided for use as cooling traps. They are rotatably mounted (241*a*), (241*b*) adjacent to the side walls (203*a*), (203*b*) of the chamber near the ceiling (204) thereof and are shown to be aligned substantially parallel to the ceiling (204) of the chamber, and they are latched in this position. They may be pivoted into the saturated vapor as required in the rotational direction indicated by arrows (242*a*), (242*b*). Moreover, openings (205*a–d*) are provided at the ceiling (204) of the chamber through which a protective gas, such as a noble gas or nitrogen, for instance, may be fed into the vacant space of the chamber.

A transport arrangement not shown in detail in FIG. 2 moves a module (250) to be soldered, which may have been preheated, into the chamber through an entrance lock at position (280), lowers the module approximately to the level of the apex (213) of the solder wave (212), thereafter moves the lower surface of the module support into contact (see FIG. 2) with the solder wave (212) and through an exit lock (282) it moves the soldered module along the transport path (281) out of the chamber.

Figure 3:
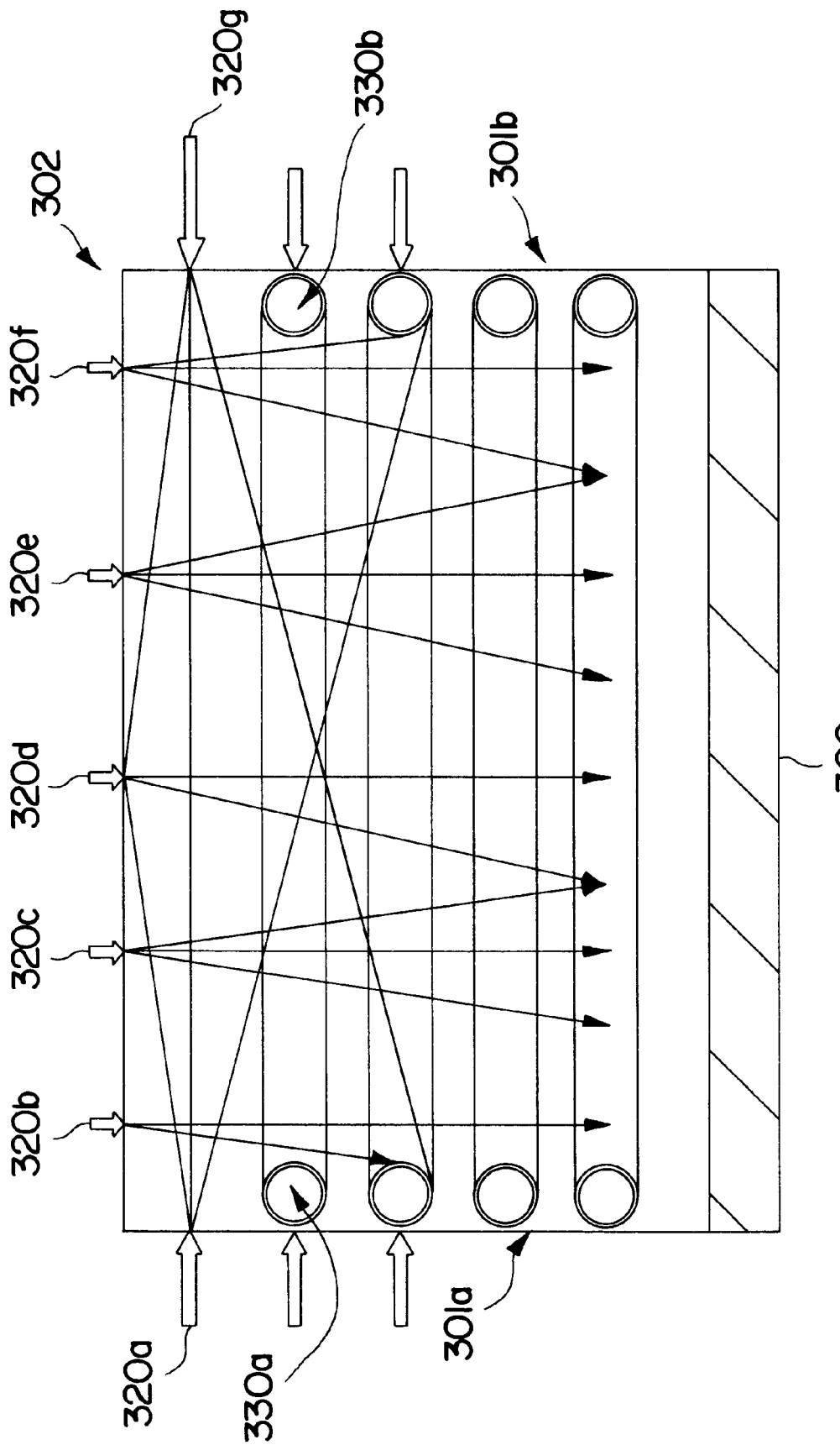
FIG. 3: is a cross-sectional presentation of a soldering chamber with cooling arrangements for controlling the level of the vapor ceiling of the primary liquid vapor.

FIG. 3 schematically depicts only cooling arrangements of another in connection embodiment of the invention, which serve to set and/or control the shape of the vapor ceiling, and more particularty the variable setting of the level of a planar vapor ceiling. Within the soldering chamber (300) at the side walls (301a), (301b) there are provided cooling arrangements structured as pipe systems (cross section of the pipe: (330a), (330b)) which as in the case of the embodiments of FIG. 1 and FIG. 2 may be mechanically moved. Aside from the mechanical movement of the entire pipe system at each side wall, the individual pipes may also be fed independently of each other with a cooling medium (such as water or primary liquid or liquid nitrogen) and they may thus be used in a dual manner for setting the ceiling of the vapor. In addition, nozzles (320a–g) indicated by arrows are provided at the ceiling (302) of the chamber and at the adjacent sides of the chamber for injecting precise amounts of primary liquid at an adjustable temperature into the chamber and, thus, into the saturated vapor. By condensation of the vapor at the introduced primary liquid droplets a defined and quick regulation of the vapor ceiling, especially of its shape and level, may be obtained. In general, the cooling arrangements used have to be structured and coordinated relative to each other with respect to the purpose to be attained, such as a planer vapor ceiling and/or a precisely defined vapor ceiling level.

Figure 4:
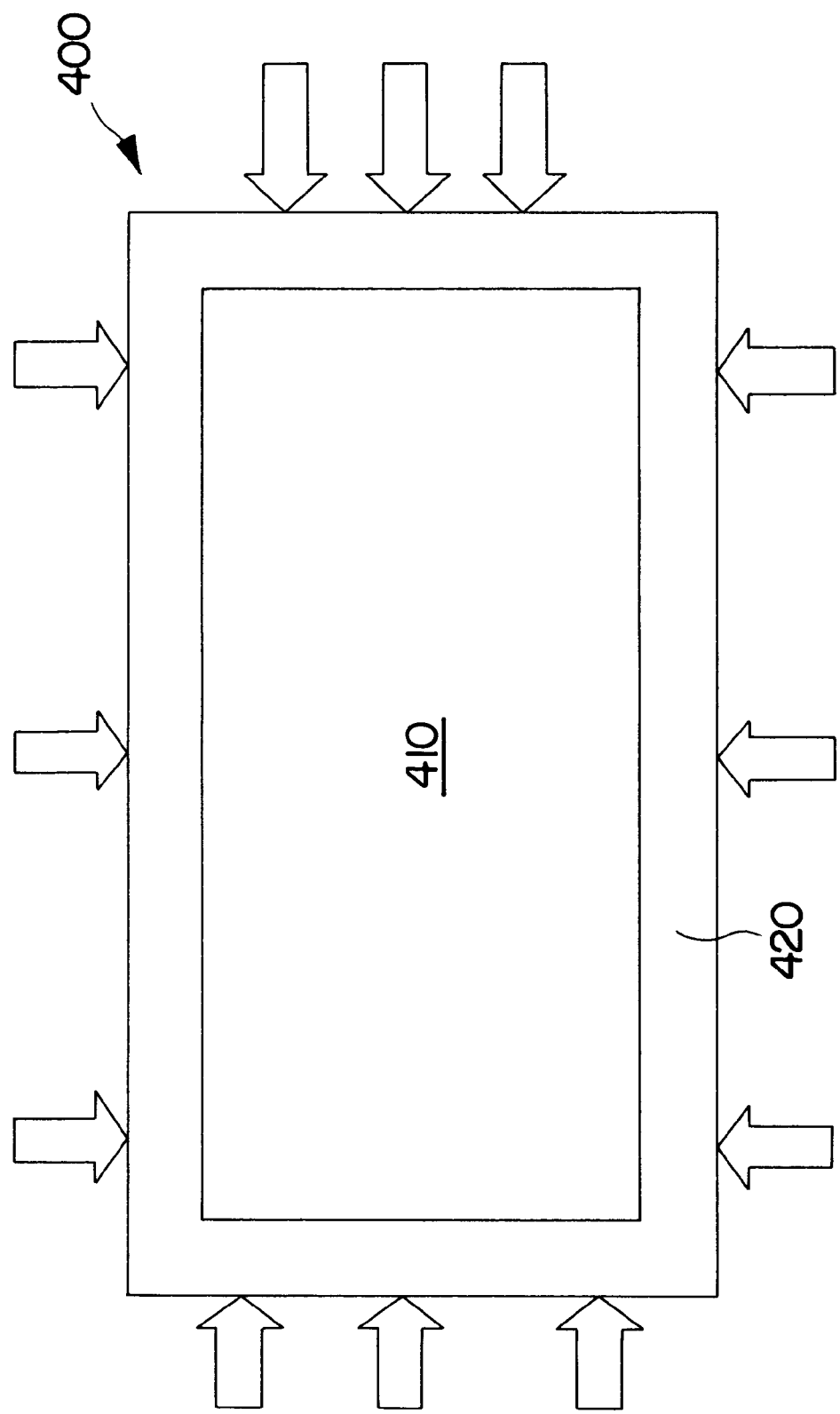
FIG. 4: is top elevation of the bottom of the soldering chamber with the solder bath and condensate groove.
Figure 5:
FIG. 5: is a comparison of various types of components.
Figure 5:
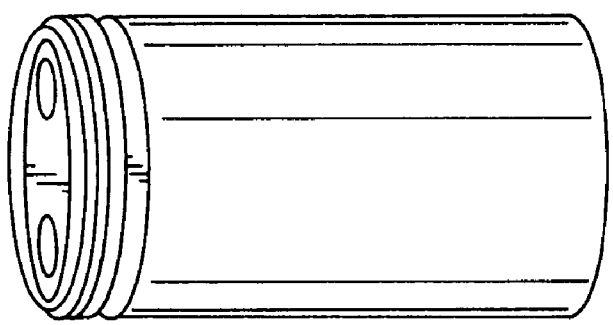
Figure 6:
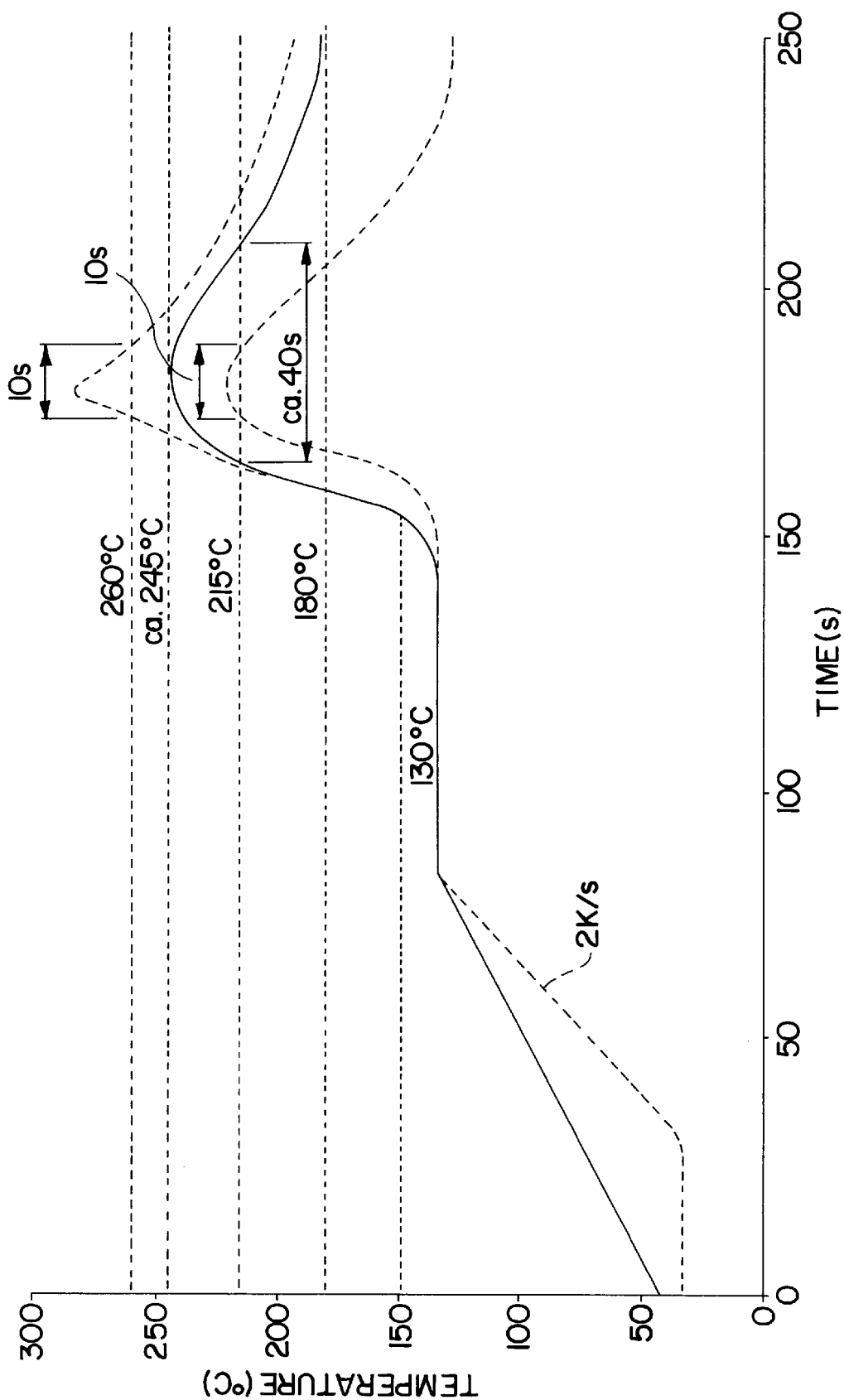
FIG. 6: an infrared soldering, temperature and time diagram (temperature at the connector) according to CECC 00802 (solid line: typical of the process; broken line: limits of the process)
Figure 7:
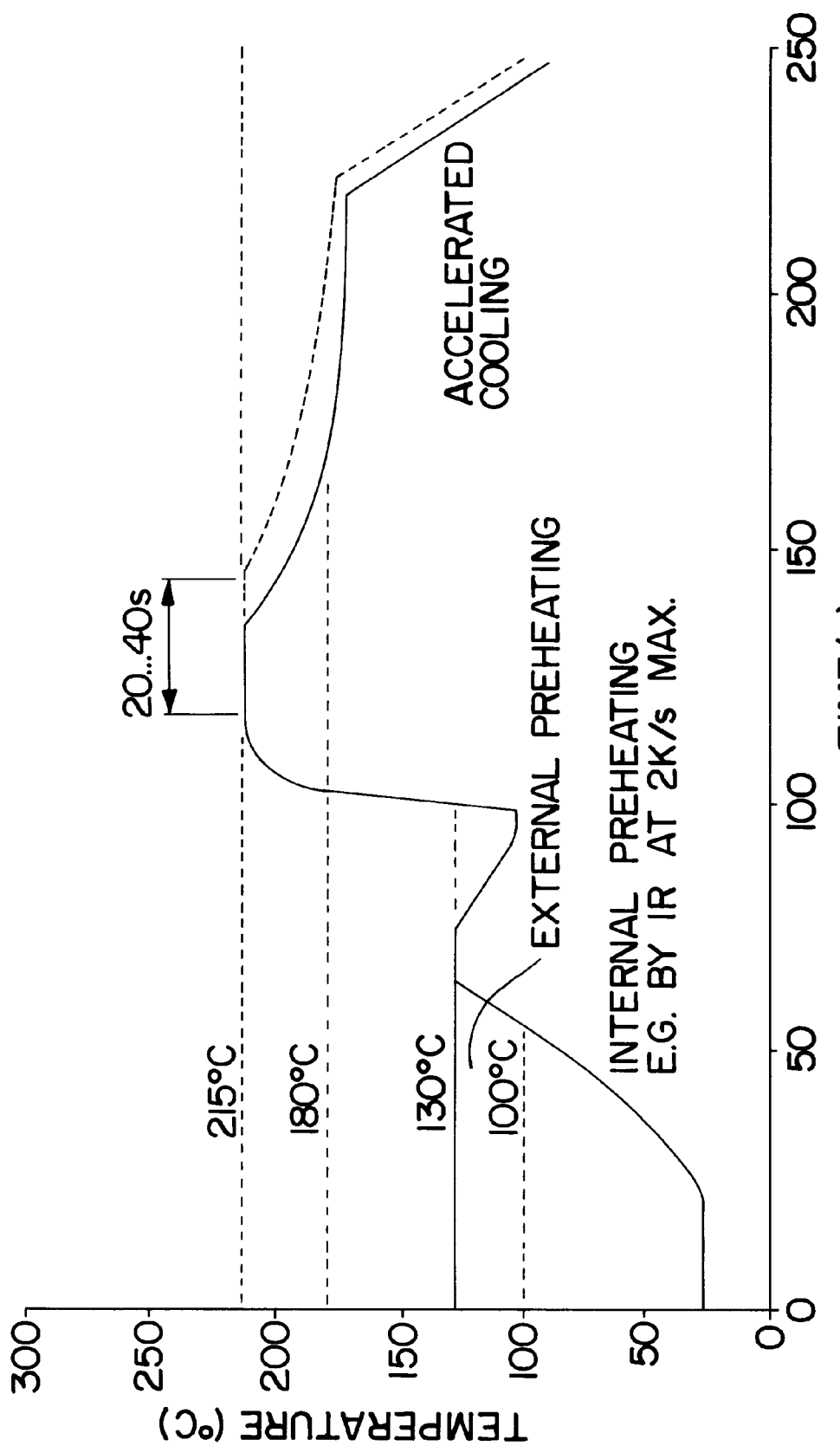
FIG. 7: represents vapor phase soldering, temperature and time diagram (temperature at the connector) according to CECC 00802 (solid line: Typical of the process; broken line: limits of the process)
Figure 8:
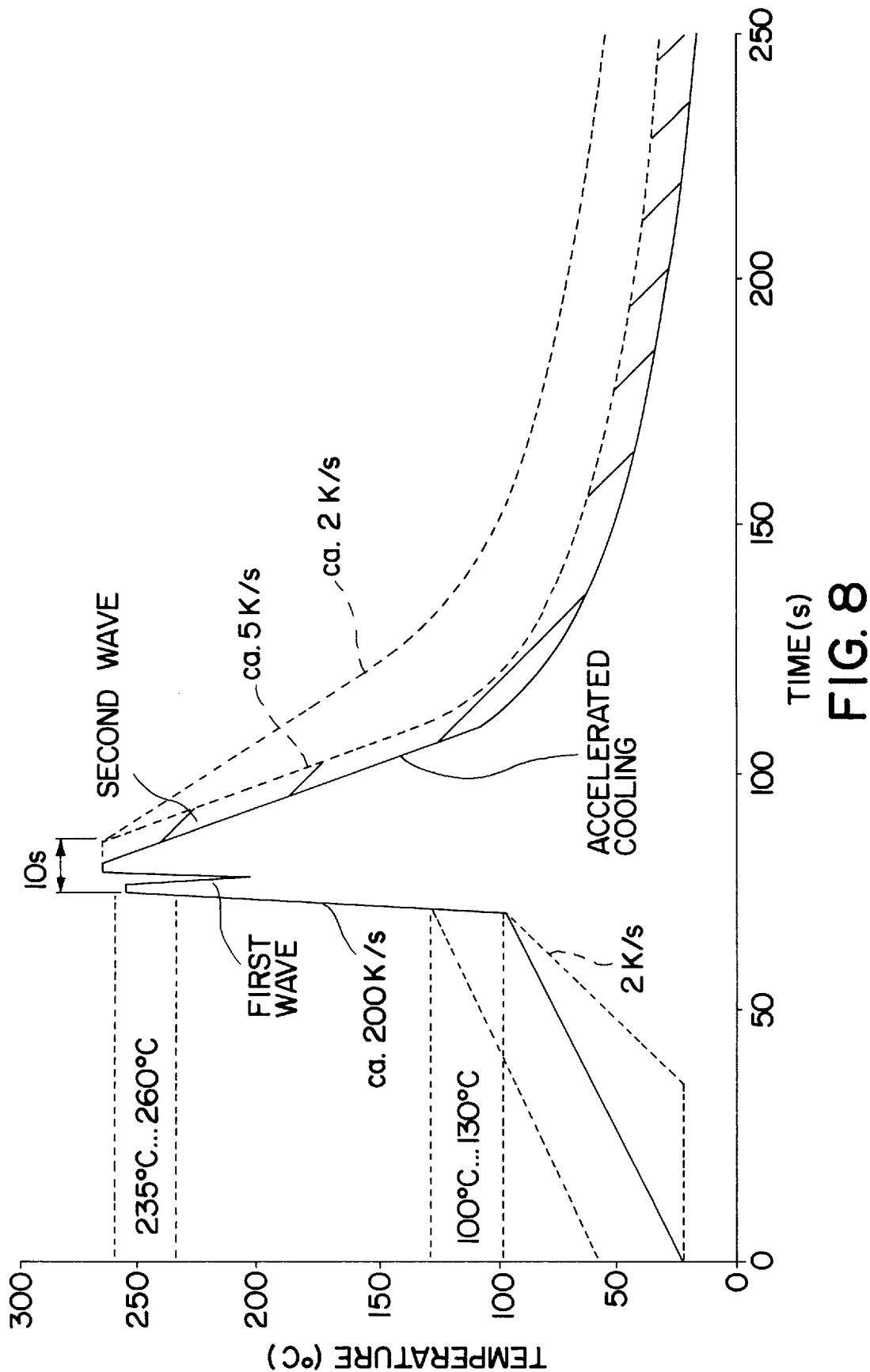
FIG. 8: represents double-wave soldering, temperature and time diagram (temperature at the connector) according to CECC 00802 (solid line: typical of the process; broken line: limits of the process)
Figure 9A:
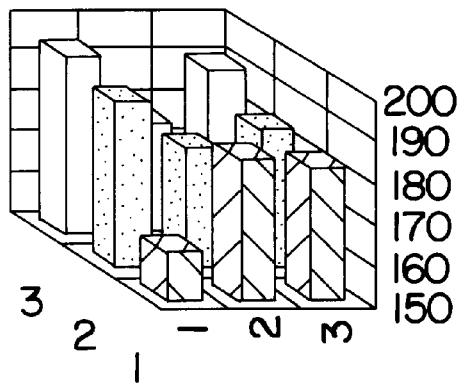
FIG. 9*a–d*: temperature distribution at nine positions of a circuit board after introduction of the circuit board into the interface of vapor and aerosol.
Figure 9B:
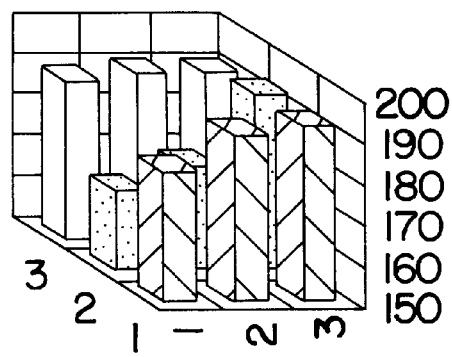
Figure 9C:
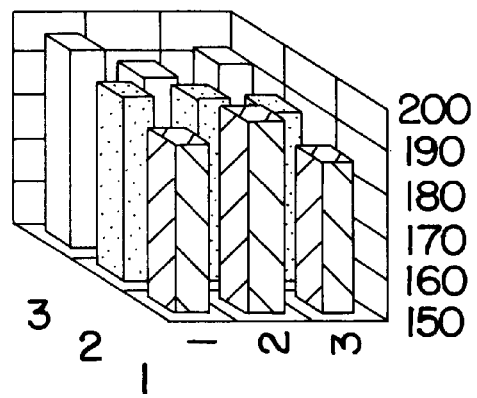
Figure 9D:
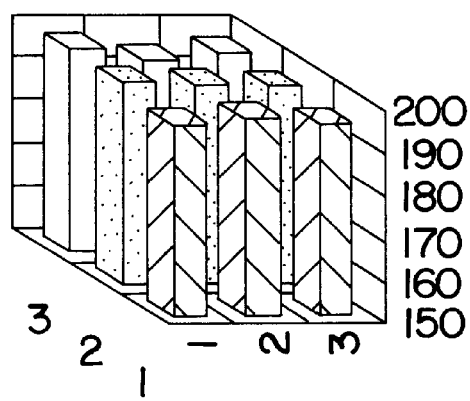

In respect of a further embodiment of the invention FIG. 4 depicts a top elevation through the primary liquid vapor in the direction of the bottom of a soldering chamber (400). The bottom of the chamber, which cannot be seen in FIG. 4, is covered by a solder bath (410). Separated from this solder bath there is provided at the side walls of the solder chamber a groove (420) for precipitation of primary liquid vapor condensed by the cooling arrangements. The condensed primary liquid vapor introduced into the condensate groove is indicated by arrows in FIG. 4.

In another embodiment of the invention the cooling arrangements are structured as cooling coils of preferably circular pipe cross-section, whereby the cooling coils are compressed about half-way into a plate-like member, preferably made of metal, in order to yield a high degree of effectiveness of the cooling arrangement (aerosol trap).

What is claimed is:

1. A method of applying solder to contacts of electronic components including a heat-sensitive portion in a chamber filled at least in part by saturated vapor of a primary liquid, comprising the steps of:
   placing the electronic component within the chamber such that its heat-sensitive portion is only partially disposed within the saturated vapor; and
   placing the contacts to which solder is to be applied into the saturated vapor.

2. The method of claim 1, further comprising the step of controlling the level of saturated vapor within the chamber.

3. The method of claim 2, wherein the level of saturated vapor is controlled by cooling.

4. The method of claim 3, wherein the cooling is provided by cooling ducts mounted for vertical movement relative to the chamber.

5. The method of claim 3, wherein the cooling is provided by cooling plates mounted in the chamber for selective movement relative to the vapor.

6. The method of claim 2, wherein the level of saturated vapor is controlled by injecting a liquid of a temperature lower than the vapor into the chamber.

7. The method of claim 6, wherein the liquid is injected into the vapor through at least one nozzle connected to the chamber.

8. The method of claim 7, further including the step of controlling the sizes of the nozzle.

9. The method of claim 1, further comprising the step of providing a layer of a protective gas over the saturated vapor.

10. The method of claim 1, further comprising the step of providing a bath of molten solder below the saturated vapor.

11. The method of claim 10, further comprising the step of applying the solder to the contacts by a solder wave having a crest substantially coinciding with the contacts.

12. The method of claim 11, further comprising the step of preheating the electronic component prior to the application of solder.

13. The method of claim 12, wherein the electronic component is preheated by infrared radiation prior to entry into the chamber.

14. The method of claim 12, wherein the electronic component is preheated by heated primary liquid.

15. The method of claim 12, wherein the electronic component is preheated by the saturated vapor in the chamber prior to the application of solder.

16. The method of claim 10, wherein the electronic component is provided with upper and lower surfaces and further comprising the step of heating the upper and lower surfaces to different temperatures by the primary liquid having a boiling point different from the temperature of the solder.

17. The method of claim 16, further comprising the steps of applying the solder at a temperature above its melting point and providing a primary liquid having a boiling point not lower than the solder application temperature.

18. The method of claim 11, further comprising the step of raising the temperature of the solder wave by the vapor.

19. The method of claim 17, wherein the solder comprises a lead-free material having a melting point higher than the eutectic temperature of lead-tin solder material and lower than the solder application temperature and wherein the solder is applied at a temperature in a range between 240° C. and 260° C.

20. An apparatus for applying solder to contacts of electronic components comprising at least one heat-sensitive portion, comprising:
   a plurality of walls for forming a solder application chamber adapted to be at least partially filled by saturated vapor of a primary liquid; and
   means for varying the level of saturated vapor within the chamber.

21. The apparatus of claim 20, further comprising means for preheating an electronic component prior to the application of solder.

22. The apparatus of claim 21, wherein the means for preheating comprises a source of infrared radiation.

23. The apparatus of claim 21, wherein the means for preheating comprises a least one nozzle within the chamber for applying heated primary liquid to the electronic component.

24. The apparatus of claim 20, further comprising a heatable primary liquid reservoir communicating with the saturated vapor in the chamber.

25. The apparatus of claim 24, further comprising means for controlling the communication between the primary liquid in the reservoir and the vapor in the chamber.

26. The apparatus of claim 24, further comprising means for controlling the level of saturated vapor within the chamber.

27. The apparatus of claim 26, wherein the level controlling means are mounted for movement relative to at least one wall.

28. The apparatus of claim 27, wherein the level controlling means comprises at least one cooling duct mounted for vertical movement along the wall.

29. The apparatus of claim 27, wherein the level controlling means comprises at least one cooling plate mounted within the chamber for movement relative to the saturated vapor.

30. The apparatus of claim 27, wherein the level controlling means comprises at least one nozzle for injecting primary liquid into the chamber.

31. The apparatus of claim 24, further comprising means for controlling the level of saturated vapor in the chamber by condensation and means for feeding the condensed vapor to the reservoir.

32. The apparatus of claim 20, wherein the level of saturated vapor comprises a substantially planar surface and wherein means is provided for disposing the electronic component at a predetermined orientation relative to the surface.

33. The apparatus of claim 32, further comprising means for providing a protective gas over the surface.

34. The apparatus of claim 33, further comprising means for providing a solder wave having a crest extending into the saturated vapor for engaging the contacts of the electronic component.

35. The apparatus of claim 34, wherein the means for providing the solder wave comprises an electrodynamic pump.

* * * * *